United States Patent
Haibara

(10) Patent No.: US 10,121,649 B2
(45) Date of Patent: Nov. 6, 2018

(54) CLEANING METHOD OF SEMICONDUCTOR WAFER

(75) Inventor: Teruo Haibara, Yamaguchi (JP)

(73) Assignee: SILTRONIC AG, Munich (DE)

( * ) Notice: Subject to any disclaimer, the term of this patent is extended or adjusted under 35 U.S.C. 154(b) by 705 days.

(21) Appl. No.: 12/592,706

(22) Filed: Dec. 1, 2009

(65) Prior Publication Data

US 2010/0139711 A1 Jun. 10, 2010

(30) Foreign Application Priority Data

Dec. 4, 2008 (JP) .................................. 2008-309283

(51) Int. Cl.
*B08B 3/00* (2006.01)
*H01L 21/02* (2006.01)
*B08B 3/10* (2006.01)
*B08B 3/12* (2006.01)

(52) U.S. Cl.
CPC .......... *H01L 21/0209* (2013.01); *B08B 3/003* (2013.01); *B08B 3/102* (2013.01); *B08B 3/12* (2013.01); *H01L 21/02052* (2013.01)

(58) Field of Classification Search
None
See application file for complete search history.

(56) References Cited

U.S. PATENT DOCUMENTS

| | | | |
|---|---|---|---|
| 5,226,969 A | 7/1993 | Watanabe et al. | |
| 6,418,942 B1 * | 7/2002 | Gray et al. | 134/1.3 |
| 7,176,173 B2 | 2/2007 | Takashima | |
| 2001/0025017 A1 * | 9/2001 | Amemiya et al. | 510/175 |
| 2002/0016272 A1 | 2/2002 | Kakizawa et al. | |
| 2004/0187891 A1 * | 9/2004 | Chou et al. | 134/1 |
| 2005/0139230 A1 | 6/2005 | Miyata et al. | |
| 2006/0137719 A1 | 6/2006 | Hasegawa et al. | |
| 2008/0156347 A1 | 7/2008 | Haibara et al. | |

FOREIGN PATENT DOCUMENTS

| | | |
|---|---|---|
| CN | 1876786 A | 12/2006 |
| CN | 101169597 A | 4/2008 |
| EP | 1753015 A2 | 2/2007 |
| JP | 63-274149 A | 11/1988 |
| JP | 4-215880 A | 8/1992 |
| JP | 08213356 A | 8/1996 |
| JP | 11-354476 A | 12/1999 |
| JP | 2007-098361 A | 4/2007 |
| JP | 2008-103701 A | 5/2008 |
| KR | 10-0511915 B1 | 11/2004 |
| KR | 2007-0018689 A | 2/2007 |
| KR | 10-0755774 B1 | 8/2007 |
| KR | 100845966 B1 | 7/2008 |
| WO | 2004053045 A1 | 6/2004 |

OTHER PUBLICATIONS

Satoshi Ueyama et al., "The World of Microbubbles" Kogyo Chosakai Publishing Co., Ltd. (2006).

* cited by examiner

*Primary Examiner* — Mikhail Kornakov
*Assistant Examiner* — Ryan L. Coleman
(74) *Attorney, Agent, or Firm* — Brooks Kushman P.C.

(57) ABSTRACT

A wax removal method uniformly removes wax adhering to a wafer surface and reduces the problems of re-adhesion of particles and filter clogging of a cleaning bath during cleaning. The method uses cleaning liquid which contains microbubbles.

10 Claims, 2 Drawing Sheets

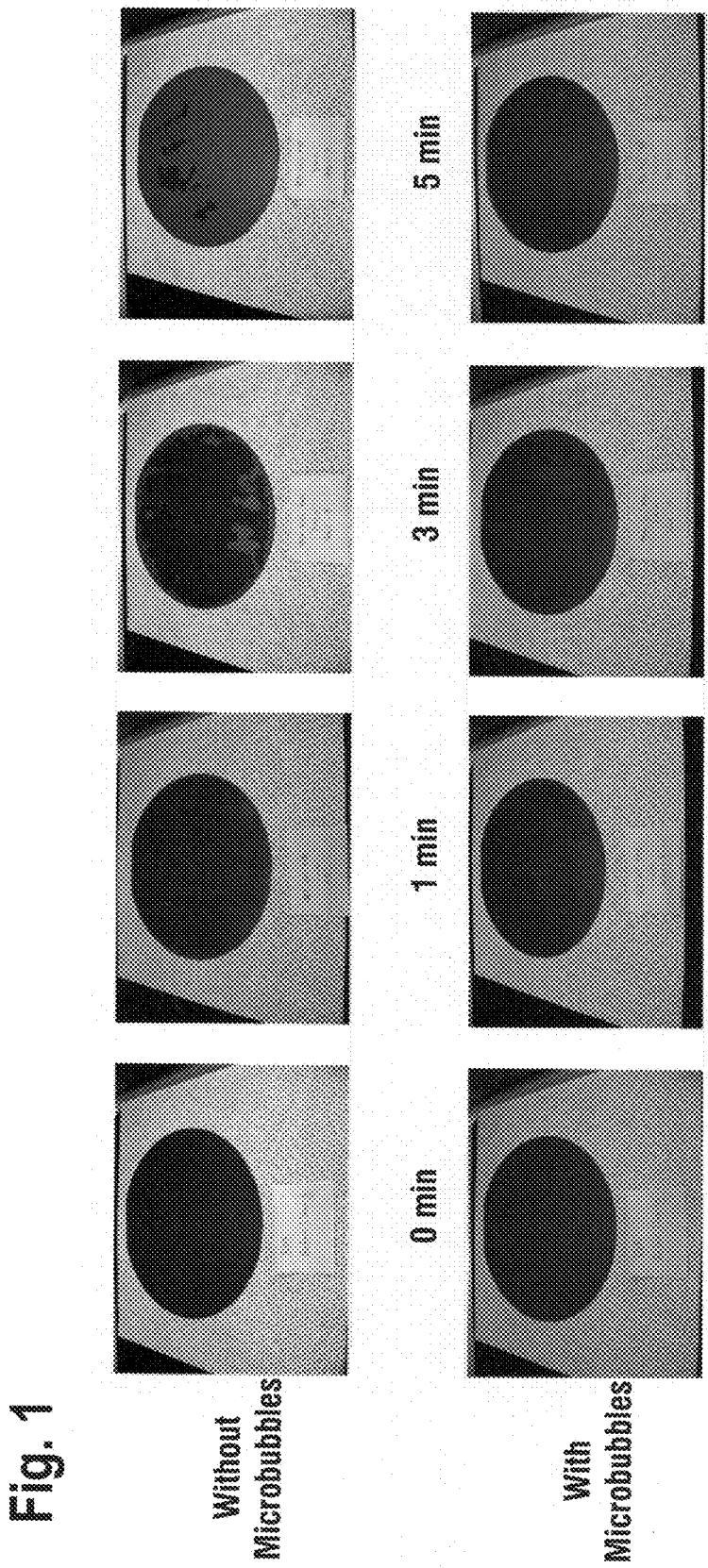

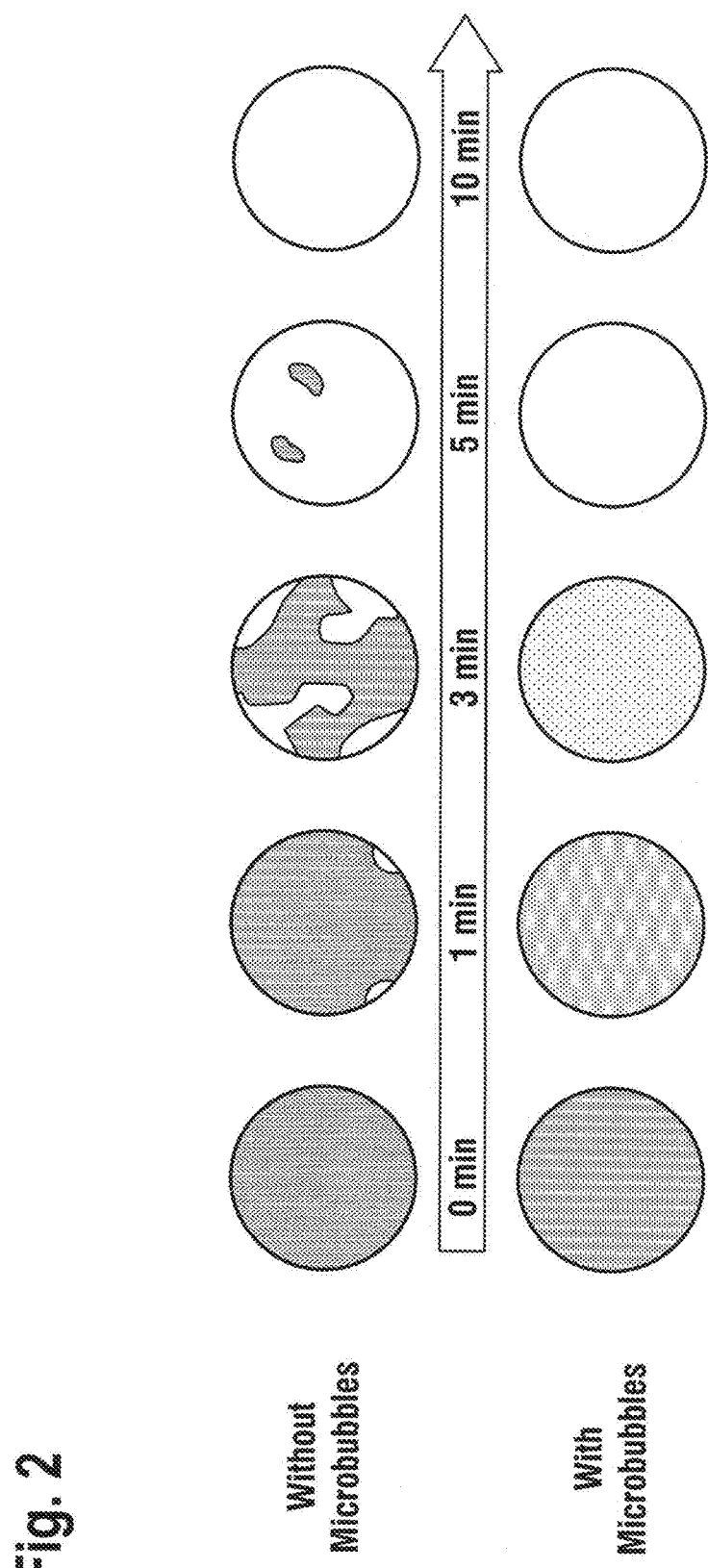

CLEANING METHOD OF SEMICONDUCTOR WAFER

CROSS-REFERENCE TO RELATED APPLICATIONS

This application claims priority to Japanese Application JP2008-309283 filed Dec. 4, 2008, which is herein incorporated by reference.

BACKGROUND OF THE INVENTION

1. Field of the Invention

The present invention relates to a cleaning method carried out in a step of processing a semiconductor wafer of, for example, silicon.

2. Background Art

A semiconductor wafer (substrate) used in a semiconductor device is produced by processing an ingot block, which is grown by the Czochralski method or the floating zone method, into a mirror-surface-like thin plate. In processing steps thereof, mainly, (1) a slicing step of slicing the ingot block into wafers, (2) a beveling step of beveling an outer peripheral part of the sliced wafers, (3) a planarization step of planarizing the beveled wafers by using, for example, lapping or surface grinding, (4) an etching step for removing processing distortion of the planarized wafers, (5) a polishing step of polishing both surfaces or one surface of each of the etched wafers, (6) a thermal treatment step, an inspection step, various cleaning steps etc. are carried out.

Conventionally, in the polishing step of polishing one surface of a wafer, wax is applied onto one surface of the wafer that is to be polished, it is fixed to a turntable, and the other surface is polished. After this polishing step, in order to remove the wax adhering to the wafer and the particles adhered thereto during the process, cleaning using bases, etc. is carried out (see Japanese Unexamined Patent Application Publication No. 8-213356). In this method, the wax adhering to the wafer surface is sometimes removed in such a manner that it is exfoliated instead of being completely dissolved in a cleaning liquid, and there has been a possibility of residual wax remaining on the wafer after the cleaning.

SUMMARY OF THE INVENTION

The present inventor has discovered a problem with the conventional techniques of a cleaning method, as the undissolved wax, exfoliated as a solid, re-adheres onto the wafer as particles, contaminating the wafer, and causing clogging of filters of cleaning baths. It is an object of the present invention to provide a cleaning method capable of solving the above described problem and efficiently carrying out wax removal of the wafer. In order to solve these and other problems, it has now been surprisingly discovered that the wax adhering to the surface of the wafer can be uniformly removed while completely dissolving the wax into cleaning liquid, without exfoliating the wax as a solid, by cleaning the wafer by using a cleaning liquid containing microbubbles.

BRIEF DESCRIPTION OF THE DRAWINGS

FIG. 1 are photographs of wafers wherein wax removal is accomplished with and without microbubbles.

FIG. 2 illustrates schematically removal of wax from wafers with and without microbubbles.

DETAILED DESCRIPTION OF THE PREFERRED EMBODIMENTS

More specifically, the present invention relates to a cleaning method of removing wax which adheres to a semiconductor wafer surface, by using a cleaning liquid, the cleaning method characterized in that the cleaning liquid contains microbubbles.

Furthermore, the present invention relates to a cleaning method, wherein the cleaning liquid contains an alkaline component and a surfactant, and more particularly wherein the alkaline component is ammonia or organic ammonium hydroxide. Furthermore, the present invention relates to a cleaning method, wherein the semiconductor wafer is a silicon wafer.

In the cleaning method according to the present invention, by using a cleaning liquid containing microbubbles, the wax adhering to the surface of the wafer can be uniformly removed while dissolving in the cleaning liquid without exfoliating as a solid, and the risk of re-contaminating the wafer by the particles generated by the wax which is exfoliated as a solid in a wax removal process can be lowered.

The present invention thus relates to a cleaning method for removing wax that adheres to a semiconductor wafer surface by using a cleaning liquid, the cleaning method characterized in that the cleaning liquid contains microbubbles.

No particular limitation is imposed on the material, shape, etc. of the wafer which can be cleaned by the cleaning method of the present invention. The material includes various materials used in conventional semiconductor fabrication. Specifically, the material includes Si, Ge, As, or a composite material thereof. In the present invention, the shape of the wafer includes the shapes formed during various processing steps which are conventional publicly-known various shapes. Preferably, silicon wafers in the stages of normal silicon wafer fabrication steps are included.

In the cleaning method of the present invention, the wax serving as a removal target is the wax which is used in a polishing step, etc. of a normal semiconductor wafer, no particular limitation is imposed also on the type thereof, and the wax generally comprises a wax component of a wax-like substance, a resin component, and an additive. Examples of the wax component for controlling viscosity, extension, and flexibility, which mainly relate to polishing accuracy, include natural-based substances such as beeswax, oils and fats, carnauba, sumac wax, and paraffin and synthetic-based substances such as polyethylene glycol and polypropylene glycol. Examples of the resin component for controlling adhesion force, resistance to shock, hardness, etc., which mainly relate to retention force, include natural-based substances such as shellac, rosin, and pitch and synthetic-based substances such as vinyl acetate, nylon, acrylic, and various polymers. Examples of the additives for controlling cleaning performance, antioxidation, thermal resistance, wettability, etc. include various surfactants. The application form thereof is also not particularly limited, and examples thereof include spray wax, solid wax, and coating agents.

As the cleaning liquid, a cleaning liquid can be used with no particular limitation as long as the cleaning liquid is used for removing the wax, and, specifically, an aqueous liquid which is advantageous in performing removal of oils and fats, resins, particles, etc., containing an alkaline component and surfactant, is preferred.

Examples of the alkaline component include alkali metal hydroxides such as lithium hydroxide, sodium hydroxide, and potassium hydroxide; alkaline-earth metal hydroxides such as calcium hydroxide, magnesium hydroxide, and barium hydroxide; inorganic ammonium hydroxides such as ammonia and hydroxylamine; organic ammonium hydroxides such as monomethylammonium hydroxide, dimethylammonium hydroxide, trimethylammonium hydroxide, tetramethylammonium hydroxide, tetraethylammonium hydroxide, (n- or i-) tetrapropylammonium hydroxide, (n-, i-, or t-) tetrabutylammonium hydroxide, tetrapentylammonium hydroxide, tetrahexylammonium hydroxide, and choline; and mixtures thereof. Among these inorganic and organic ammonium hydroxides, ammonia, tetramethylammonium hydroxide, or choline which can obtain chemical liquid of a high cleaning level at comparatively low cost for semiconductor cleaning is preferably used.

The surfactant is added for improving the solubility of the wax which is the removal target, and a suitable surfactant can be selected in accordance with the wax which is the removal target. Examples of the surfactant include nonionic surfactants, anionic surfactants, cationic surfactants, ampholytic surfactants, and mixtures thereof.

Examples of the nonionic surfactants include polyoxyalkylene type nonionic surfactants and polyhydric alcohol type nonionic surfactants. Specific examples of the polyoxyalkylene type nonionic surfactant include higher alcohol, alkylphenol, higher fatty acid, higher alkylamine, or the like onto which alkylene oxide (for example, ethylene oxide (EO), propylene oxide, or butylene oxide) is polymerized. Examples of the polyhydric alcohol type nonionic surfactant include polyhydric alcohol fatty acid esters, polyhydric alcohol alkyl ethers, fatty acid alkanolamides, etc.

Examples of the anionic surfactants include carboxylic acids, for example saturated or unsaturated fatty acids having 8-22 carbon atoms or salts thereof; sulfuric ester salts, for example, higher alcohol sulfuric ester salts such as sulfuric ester salts of aliphatic alcohols having 8-18 carbon atoms; higher alkyl ether sulfuric ester salts such as sulfuric ester salts of EO (1 to 10 mol) adducts of aliphatic alcohols having 8-18 carbon atoms; sulfate oil, for example salts obtained by sulfating and neutralizing natural unsaturated oil and fat or unsaturated wax without modification; fatty acid ester sulfates, for example salts obtained by sulfating and neutralizing lower alcohol esters of unsaturated fatty acids; sulfated olefins, for example salts obtained by sulfating and neutralizing olefins having 12-18 carbon atoms; sulfonates, for example alkylbenzene sulfonates, alkyl naphthalene sulfonates; sulfosuccinic acid diester type surfactants; $C_{12-18}$ α-olefin sulfonates; and phosphoric ester salts, for example higher alcohol (8-60 carbon atoms) phosphoric ester salts. Examples of the salts include alkali metal (sodium, potassium, etc.) salts, alkaline-earth metal (calcium, magnesium, etc.) salts, ammonium salts, alkylamine salts, and alkanolamine salts.

Examples of the cationic surfactants include quaternary ammonium salts such as tetraalkylammonium salts, alkylpyridinium salts, and amine salts, for example inorganic acid salts of higher amines such as lauryl amine.

Examples of the ampholytic surfactant include amino acid type ampholytic surfactants, for example sodium propionates of higher $C_{12-18}$ alkylamines, sulfuric ester salt type ampholytic surfactants, for example sulfuric ester sodium salts of higher $C_{8-18}$ alkylamines, and sulfonate type ampholytic surfactants such as pentadecyl sulfotaurine.

The amount of the surfactant used is normally 30% or less, preferably 1 to 20%, based on the total weight of the cleaning agent.

The aqueous liquid in which the above described alkaline component and the surfactant are dissolved is preferably ultrapure water from the viewpoint of prevention of wafer contamination.

In the cleaning method of the present invention, the species of the gas of the microbubbles is not particularly limited; however, specific examples thereof include air, hydrogen, helium, nitrogen, oxygen, and argon. The microbubbles of the present invention include not only a single gas component, but also those comprising two or more gas components. Specifically, examples thereof include two or more species of gas components selected from a group consisting of air, hydrogen, helium, nitrogen, oxygen, and argon.

The preparation method of the microbubbles is also not particularly limited, and the microbubbles can be generated in the cleaning liquid by introducing a gas by using publicly known microbubble generating methods or generating devices. As a microbubble generating method, various methods described in publicly known documents can be applied (for example, "The World of Microbubbles" written by Satoshi Ueyama and Makoto Miyamoto, Kogyo Chosakai Publishing, Inc. (2006)). Examples of the microbubble generating device include a high-speed shear flow type microbubble generating device.

The generating conditions of the microbubbles used in the cleaning method of the present invention and the amount of the generated microbubbles are also not particularly limited. Based on the volume and shape of the cleaning device used, the number of silicon wafers, the installation method, the temperature of the cleaning liquid, the cleaning time, and other additives of the cleaning liquid, a microbubble generating amount in a suitable range can be easily selected.

The position where the microbubbles are generated is also not particularly limited, and a nozzle providing the microbubbles can be positioned at any point of a cleaning container. A suitable position can be arbitrarily selected based on the volume and shape of the cleaning device used, the number of silicon wafers, the installation method, the temperature of the cleaning liquid, cleaning time, and other additives of the cleaning liquid. Specifically, examples thereof include a bottom location, a side-surface location, an upper part of the cleaning container, or a plurality of such locations.

A method in which microbubbles are generated in a container which is different from the cleaning container, and are then introduced into the cleaning container by using a conveying pump can be also employed. A method in which the cleaning container and a container for producing microbubble water are coupled to each other by circulation piping which is circulated by a conveying pump can be also employed. A method in which the microbubble generating device is installed at an intermediate part of conveying piping, and microbubble water is introduced to the cleaning container can be also employed.

In the above described embodiments, the description is based on the assumption of a mode in which the wafer is immersed in the cleaning container filled with the cleaning liquid; however, shower cleaning, spray cleaning, etc. may be used. Also, cleaning can be carried out while using ultrasonic waves in combination.

Hereinafter, the present invention will be explained in more detail based on an example.

1. Experimental Method

In accordance with the description below (1), a wafer having one surface onto which wax was applied was prepared, and the wafer was cleaned by the method of (2).

(1) Preparation of the Wafer Having One Surface onto which Wax is Applied

Skyliquid (wax produced by Nikka Seiko Co. Ltd. (hydrogenerated rosin+isopropyl alcohol+toluene)) was applied as wax onto an 8-inch P-type silicon wafer. A mirror surface of the silicon wafer was upwardly set in a spin coater, and, while rotating at 3000 rpm, 3 mL of the stock solution of skyliquid was measured by a pipette and poured in from the center of the substrate. After 20 seconds, the rotation was stopped, and the wafer was dried naturally.

(2) Cleaning Method

As liquid cleaning chemical composition, ANC-1 (produced by Tama Chemicals Co., Ltd., 10% or less of TMAH (tetramethylammonium hydroxide)+surfactant) diluted 20 fold by ultrapure water was used, and cleaning was carried out at a liquid temperature of 20° C. Conditions of the example and a comparative example are as described below.

Example

One nozzle of a microbubble generating device (M2-MS/PTFE type, produced by Nanoplanet Research Institute Corporation) was provided at a position of the bottom of a 4 L cleaning bath filled with the cleaning liquid, and microbubbles of 1 L/min were continuously generated and introduced. Air was used as the gas for the bubbles. After the microbubbles were introduced for five minutes, the silicon wafer having the surface onto which the wax was applied was immersed therein. During the immersion, the microbubbles were continually generated. After the wafer was immersed for predetermined time (for 1, 3, 5, or 10 minutes), the wafer was immersed in an ultrapure water rinse bath for one minute, and the cleaning liquid was rinsed off. Then, the wafer was pulled up and dried by blowing dry air onto the wafer surfaces.

Comparative Example

Except that the microbubbles were not generated, operations similar to those of the example were carried out.

2. Evaluation Method

The wax removal state of each wafers and the state of the cleaning liquid were visually evaluated.

3. Experimental Results

The results of observing the wax removal state of the wafers are shown in FIG. 1 (photos) and FIG. 2 (schematic drawings).

As a result of temporally observing the wax removal process, in the comparative example, the wax was exfoliated as particles from the periphery. It was found out that the removal of the wax was non-uniform and uneven. Therefore, the possibility that wax partially remains on the wafer is high. The wax was exfoliated in the state of a solid material, and thus the risk of particle increase and clogging of the filter is high.

On the other hand, when the microbubbles were added, the entire surface was uniformly dissolved, and the thickness of the wax was reduced in whole. Therefore, it was found out that the manner of wax removal is uniform and free from unevenness, and the possibility of partially remaining wax is low. All the wax was dissolved and removed without being exfoliated as solid material. Therefore, the risk of particle increase and clogging of the filter is low.

The cleaning method of the present invention is capable of efficiently removing the wax adhering to a wafer in a fabrication process of a semiconductor substrate; therefore, the cleaning method significantly contributes to this field.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A cleaning method of removing wax which is adhered to a semiconductor wafer surface, by using a cleaning liquid, the cleaning method comprising:

introducing a gas to the cleaning liquid by using a microbubble generating device in order to generate microbubbles in the cleaning liquid, and immersing a semiconductor wafer in the cleaning liquid which contains the microbubbles generated by the gas to clean a surface of the semiconductor wafer, wherein wax adhering to the surface of the semiconductor wafer is uniformly removed while dissolving the wax in the cleaning liquid without exfoliating the wax as a solid material, wherein the cleaning liquid is an aqueous liquid containing an alkaline component and a surfactant component, wherein the alkaline component is quaternary ammonium hydroxide, and wherein surfactant component is limited to surfactants selected from the group consisting of tetraalkylammonium salts, alkylpyridinium salts, and amine salts.

2. The cleaning method of claim 1, wherein the semiconductor wafer is a silicon wafer.

3. The cleaning method of claim 1, wherein the microbubbles are formed by introducing into the cleaning liquid at least one or more gases selected from the group consisting of air, hydrogen, helium, nitrogen, oxygen, argon, and mixtures thereof.

4. The method of claim 1, wherein a nozzle of a microbubble generating device is positioned in a cleaning container to supply microbubbles.

5. The cleaning method of claim 4, wherein the nozzle is positioned at a bottom or side location of the cleaning container.

6. The cleaning method of claim 1, wherein ultrasonic waves are introduced into the cleaning liquid.

7. The cleaning method of claim 1, wherein the wafer is a bare wafer having no microelectronic devices fabricated thereon.

8. The cleaning method of claim 1, wherein the microbubbles are air microbubbles.

9. The cleaning method of claim 1, wherein the wax is present as a contiguous coating on an entire surface of the wafer.

10. A cleaning method of removing wax which is adhered to a semiconductor wafer surface, by using a cleaning liquid, the cleaning method comprising:

introducing a gas to the cleaning liquid by using a microbubble generating device in order to generate microbubbles in the cleaning liquid, and immersing a semiconductor wafer in the cleaning liquid which contains the microbubbles generated by the gas to clean a surface of the semiconductor wafer, wherein wax adhering to the surface of the semiconductor wafer is uniformly removed while dissolving the wax in the cleaning liquid without exfoliating the wax as a solid material;

wherein the cleaning liquid comprises an alkaline component and a surfactant component wherein the surfactant component is limited to surfactants selected from the group consisting of tetraalkylammonium salts, alkylpyridinium salts, and amine salts and wherein the alkaline component comprises at least one tetraalkylammonium hydroxide.

\* \* \* \* \*